United States Patent
Chiou et al.

(10) Patent No.: US 11,337,324 B2
(45) Date of Patent: May 17, 2022

(54) MANUFACTURING METHOD OF HOUSING

(71) Applicant: ASUSTeK COMPUTER INC., Taipei (TW)

(72) Inventors: Shih-Wei Chiou, Taipei (TW); Yang-Po Chiu, Taipei (TW); Ying-Ta Tseng, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 163 days.

(21) Appl. No.: 16/867,904

(22) Filed: May 6, 2020

(65) Prior Publication Data
US 2020/0375050 A1 Nov. 26, 2020

(30) Foreign Application Priority Data

May 24, 2019 (TW) ................................. 108118155

(51) Int. Cl.
*B23P 25/00* (2006.01)
*H05K 5/02* (2006.01)
*H05K 5/00* (2006.01)

(52) U.S. Cl.
CPC .......... *H05K 5/0247* (2013.01); *H05K 5/0004* (2013.01); *B23P 25/00* (2013.01)

(58) Field of Classification Search
CPC ..... H05K 5/0247; H05K 5/0004; B23P 25/00; B23P 15/00; B21D 51/16; G06F 1/1656; G06F 1/181; G06F 1/182; B29C 71/02
See application file for complete search history.

(56) References Cited

U.S. PATENT DOCUMENTS

2020/0354822 A1* 11/2020 Lee ...................... B21D 22/022

FOREIGN PATENT DOCUMENTS

| CN | 103243282 A | * | 8/2013 |
| CN | 103243282 B | | 8/2013 |
| CN | 105671388 A | | 6/2016 |
| CN | 108251730 A | | 7/2018 |
| CN | 108300924 A | | 7/2018 |

OTHER PUBLICATIONS

Xu, Bingshe et al.; CN-103243282-A Machine Translation (Year: 2013).*

* cited by examiner

*Primary Examiner* — Lee A Holly
(74) *Attorney, Agent, or Firm* — McClure, Qualey & Rodack

(57) ABSTRACT

A manufacturing method of a housing includes the following steps: an object providing step, a shaping step, a cooling step, a tempering step and a stamping step. In the object providing step, a semi-finished object is provided. In the shaping step, the semi-finished object is heat shaped to form a plate. In the cooling step, the plate after heat shaping is cooled. In the tempering step, the plate after cooling is tempered at a low-temperature. In the stamping step, the plate after tempering at the low-temperature is stamped at a normal temperature to form a housing.

14 Claims, 5 Drawing Sheets

MANUFACTURING METHOD OF HOUSING

CROSS-REFERENCE TO RELATED APPLICATION

This application claims the priority benefit of Taiwan Application Serial No. 108118155, filed on May 24, 2019. The entirety of the above-mentioned patent application is hereby incorporated by reference herein and made a part of specification.

BACKGROUND OF THE INVENTION

Field of the Invention

Embodiments of the disclosure relate to metal processing, and in particular, to a manufacturing method of a housing of an electronic device.

Description of the Related Art

A magnesium alloy has advantages of low density, high specific strength and specific stiffness, great shock absorption, shielding property and heat conductivity, and is easily recycled, and therefore is known as an environmentally friendly engineering material. Based on the foregoing excellent properties, magnesium alloys are applied to fields of large aeronautical industries, auto industries and even portable consumer electronics.

The magnesium alloy is applied to housings of the electronic devices. In convention, a finished product (a housing of the electronic device) is obtained by executing the process of semi-solid injection under high temperature. However, the housing of the electronic device may include defects such as bubbles and dirt holes during cooling process, and it leads to poor quality.

BRIEF SUMMARY OF THE INVENTION

The disclosure provides a manufacturing method of a housing, including an object providing step, a shaping step, a cooling step, a tempering step and a stamping step. In the object providing step, a semi-finished object is provided and the semi-finished object includes a first thickness. In the shaping step, the semi-finished object is heat shaped to form a plate, and the plate includes a second thickness. The second thickness is less than the first thickness. In the cooling step, the plate after heat shaping is cooled. In the tempering step, the plate after cooling is tempered at a low-temperature. In the stamping step, the plate after tempering at the low-temperature is stamped at a normal temperature to form a housing.

DETAILED DESCRIPTION OF THE EMBODIMENTS

Figure 1:
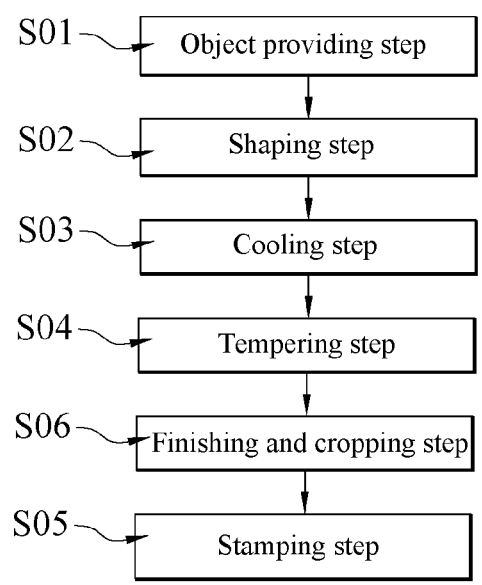
FIG. 1 is a flowchart of steps of an embodiment of a manufacturing method of a housing of the disclosure.

Referring to FIG. 1, FIG. 1 is a flowchart of steps of an embodiment of a manufacturing method of a housing of the disclosure. The housing C is of a non-planar structure with thin shell and is, but not limited to a housing of an electronic device. In an embodiment, the housing of the electronic device is a housing of a tablet, a notebook computer or a mobile phone. An embodiment of the manufacturing method of a housing of the disclosure mainly includes an object providing step (S01), a shaping step (S02), a cooling step (S03), a tempering step (S04) and a stamping step (S05).

In the object providing step (S01), a semi-finished object A is provided and the semi-finished object includes a first thickness H1. In the shaping step (S02), the semi-finished object A is heat shaped to form a plate B, and the plate B includes a second thickness H2. The second thickness H2 is less than the first thickness H1. In the cooling step (S03), the plate B after the shaping step (S02) is cooled. In the tempering step (S04), the plate B after the cooling step (S03) is tempered at a low-temperature. In the stamping step (S05), the plate B after the tempering step (S04) is stamped at a normal temperature to form the housing C.

In an embodiment, the object providing step (S01) is, but not limited to, forming the semi-finished object A through semi-solid injection process. In an embodiment, a material of the semi-finished object A is a magnesium alloy, and in this step, the shape of the semi-finished object A is, but not limited to, a board shape and the semi-finished object A includes the first thickness H1. In an embodiment, the first thickness of the semi-finished object A is 1.2 millimeters to 1.5 millimeters.

After the object providing step (S01), the shaping step (S02) is then performed on the semi-finished object A, so that the semi-finished object A forms the plate B. In an embodiment, the shaping step (S02) performs pressure process at a high temperature. In this embodiment, the high temperature depends on different materials of the semi-finished object A, and the high temperature is a temperature higher than a recrystallization temperature of the material of the semi-finished object A.

In an embodiment, the shaping step (S02) is performed at a temperature 0.5 to 0.7 times of a melting temperature of the material of the semi-finished object A. The pressure processing is, but not limited to, forging, rolling or stamping. Therefore, by performing the pressure processing on the semi-finished object A through external forces, the semi-finished object A is plastically deformed, and meanwhile a microstructure of the semi-finished object A is refined, thereby improving the structure compactness of the semi-finished object A.

Further, after the shaping step (S02), the semi-finished object A forms the plate B with a reduced thickness, and the plate B includes the second thickness H2 that is 50% to 70% of the first thickness H1. In this embodiment, the second thickness H2 is 0.4 millimeters to 0.7 millimeters. The second thickness H2 is the thickness of a final product (such as the electronic device housing). In this case, a difference between the first thickness H1 and the second thickness H2 is a reduction amount, and a ratio of the reduction amount to the first thickness H1 is a reduction rate.

Figure 2:
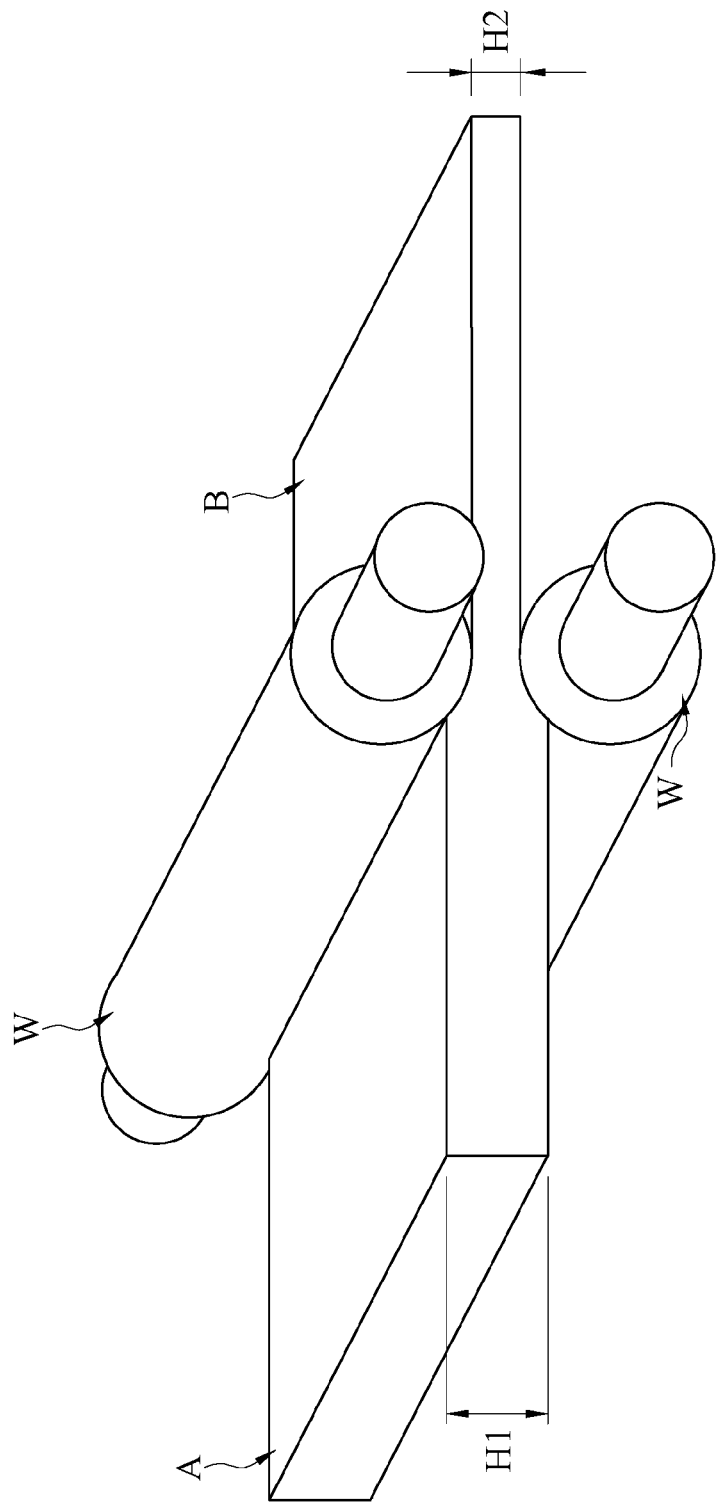
FIG. 2 is a schematic diagram of an embodiment of a shaping step in FIG. 1.

Referring to FIG. 2, in an embodiment, the shaping step (S02) is rolling (also known as calendering), rolling is a plastic working in which the semi-finished object A is rolled between a pair of rolling work rolls W to reduce the thickness of the semi-finished object A, so that the semi-finished object A forms the plate B. A thickness difference after the semi-finished object A is rolled is the reduction amount, which is 0.4 millimeters to 0.7 millimeters, and the reduction rate is 30% to 50%.

Referring to <Table 1>, Table 1 is a table of proportions of alloy components of the semi-finished object A of an embodiment. In this case, the density of the semi-finished object A formed through semi-solid injection is 1.78 g/cm$^3$, and the plate B formed after the shaping step (S02) is performed on the semi-finished object A of this embodiment actually reduces bubbles in the structure, so that the density is increased to 1.83 g/cm$^3$, that is, approximately 3% of the structure density is increased, so that the structure compactness of the plate B is actually improved. Definitely, if an increase of the number of times of the shaping step (S02) reduces the thickness of the obtained plate B, the density is further increased.

TABLE 1

| Alloy proportion (weight percentage %) | | | | | | | | |
|---|---|---|---|---|---|---|---|---|
| Al | Zn | Ca | Re | Mn | Si | Cu | Others | Mg |
| 2.5-10.5 | 0.5-1.5 | <1.5 | <1 | <0.5 | <0.5 | <0.5 | <0.1 | Margin |

In addition, in the embodiment in which the shaping step (S02) is rolling, especially a multi-pass hot rolling. Specifically, multi-pass rolling is that the semi-finished object A is rolled for a plurality of times. Hot rolling performs under a temperature higher than the recrystallization temperature (0.4 times of a melting point) of the semi-finished object A. In an embodiment, the rolling step performs at the temperature 0.5 to 0.7 times of the melting temperature. It is noted that, because the reduction rate of this embodiment is 30% to 50% which is greatly reduced with the traditional process, the semi-finished object A with the first thickness H1 is rolled, for a less number of times, to the plate B with the second thickness H2. And in this embodiment, the number of times of rolling is less than 10.

Further, in an embodiment, the semi-finished object A is hot rolled in multiple passes, for three times, to the plate B, and a reduction rate of a first pass of rolling is 20%, a reduction rate of a second pass of rolling is 6.6%, a reduction rate of a third pass of rolling is 6.6%, and a total reduction rate after the multi-pass rolling remains at 30% to 50%.

Based on this, in this embodiment, the thickness of the provided semi-finished object A is adjusted to keep the semi-finished object A and the final product in a particular proportion relationship in thickness. In this way, the total reduction rate is lowered, the number of times of performing the shaping step (S02) is reduced, and an accumulation of strains suffered by the semi-finished object A in the shaping step (S02) is reduced, thereby preventing the semi-finished object A from hardening and embrittlement due to multi-pass heat shaping (step S02), maintaining the ductility of the plate B under normal temperature and therefore ensuring the workability in the subsequent process.

It is to be noted that, the manufacturing method of a housing of this disclosure is more suitable for the use of a magnesium alloy shown in <Table 1> as the material of the semi-finished object A. Because the magnesium alloy is of a hexagonal closest packed (HCP) structure, and includes merely three slip systems at the normal temperature, and the magnesium alloy has a high processing hardening degree, poor ductility and is not easily plastically deformed. Therefore, the magnesium alloy is not suitable for thinning through repeated annealing and rolling for a plurality of times. The total reduction rate disclosed above is adjusted to enable the magnesium alloy to maintain the normal temperature ductility for subsequent normal temperature processing.

Then, after the shaping step (S02) is performed on the semi-finished object A and obtains the plate B, the cooling step (S03) is performed on the plate B. In this way, the plate B is shaped in the cooling step (S03), and grains of the plate B are prevented from being further heated to grow, so that the mechanical property is not affected.

In some embodiments, cooling the plate B in the cooling step (S03) is selected from rapid cooling or slow cooling based on a mechanical property demand (a high strength demand or a high ductility demand) of the final product. Specifically, the manner of performing the cooling step (S03) on the plate B is, but not limited to, cooling at a cooling speed of 1° C. to 50° C. per second. Further, during cooling, a cooling medium is, but not limited to, air cooling, water cooling, oil cooling or salt bath.

Then, after the cooling step (S03) is performed on the plate B, the tempering step (S04) is performed on the plate B after the cooling step (S03). In an embodiment, an operating temperature of the tempering step (S04) is 90° C. to 160° C. In this way, the plate B after the tempering step (S04) releases residual strains, and obtains a more stable structure.

Figure 3:
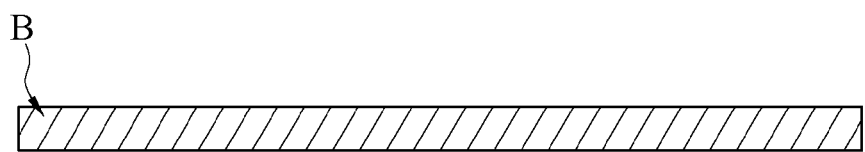
FIG. 3 is a schematic diagram of an embodiment of normal temperature stamping in FIG. 1.
Figure 3:
Figure 3:
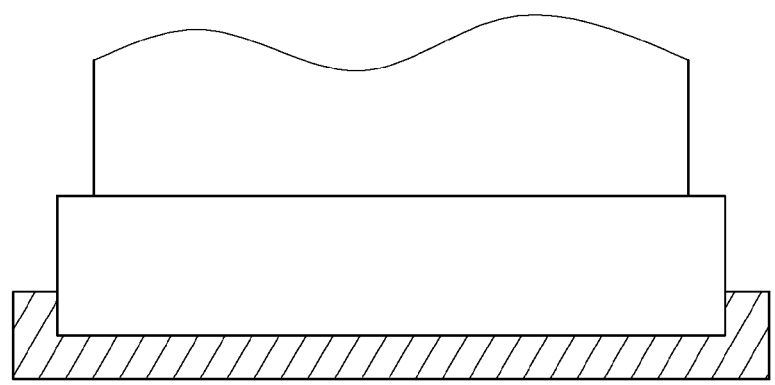
Figure 3:
Figure 3:
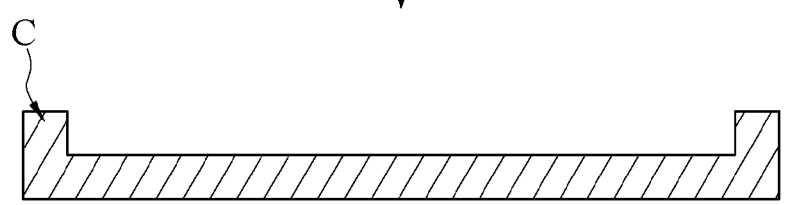

Referring to FIG. 3, then, after the tempering step (S04) is performed on the plate B, the stamping step (S05) is performed after the plate B is cooled to the normal temperature. In an embodiment, a machine that performs the stamping step (S05) on the plate B is not limited to a fly wheel press, a hydraulic press or a servo press. The plate B based on the embodiments of the disclosure maintains great normal temperature formability, and therefore, a special machine is not needed for heating-up stamping but is performed at the normal temperature, thereby reducing manufacturing device costs and improving the productivity.

Figure 4:
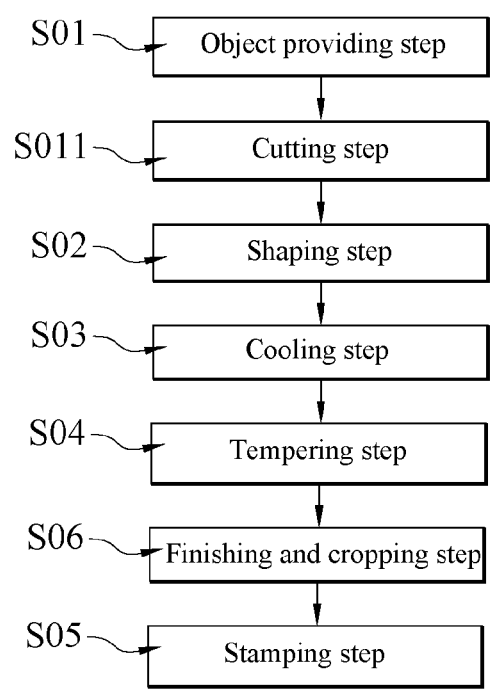
FIG. 4 is a flowchart of steps of another embodiment of a manufacturing method of a housing of the disclosure.
Figure 5:
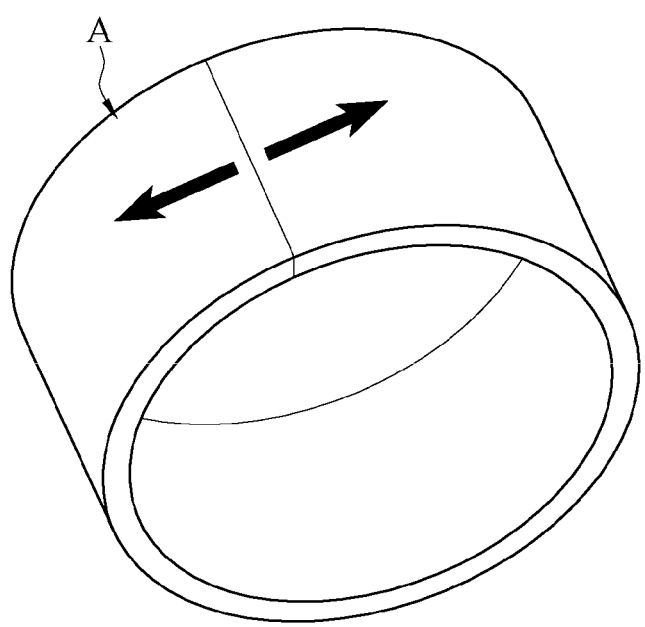
FIG. 5 is a schematic diagram of an embodiment of a cutting step in FIG. 4.

Referring to FIG. 4 and FIG. 5, in an embodiment, in the object providing step (S01), the semi-finished object A is a cylindrical semi-finished object A. In this embodiment, a cutting step (S011) is further included before the shaping step (S02). The cutting step (S011) is to cut a notch on a circumference of the semi-finished object A, so that a circular contour of the semi-finished object A is cut off. Specifically, the cutting step (S011) is performed through cutting methods such as flame cutting, laser cutting or other cutters.

After the cutting step (S011) is performed on the semi-finished object A, next, the shaping step (S02) is also performed at the high temperature. In this case, the cylindrical semi-finished object A is, but not limited to, a magnesium alloy seamless pipe, and the magnesium alloy seamless pipe is made through methods such as high temperature extrusion, hydraulic forming and deep drawing. Therefore, the semi-finished object A of this embodiment includes evenly distributed strains and a continuous microstructure.

Further, based on that the semi-finished object A includes evenly distributed strains and a continuous microstructure, the shaping step (S02) of this embodiment is to flatten the cut semi-finished object A at the high temperature. In this embodiment, the high temperature depends on different materials of the semi-finished object A, and the high temperature is a temperature higher than a recrystallization temperature of the material of the semi-finished object A.

In an embodiment, the shaping step (S02) is performed at a temperature 0.5 to 0.7 times of a melting temperature of the material of the semi-finished object A. Specifically, in this embodiment, the shaping step (S02) is to apply pressure along two sides of the notch of the semi-finished object A to flatten the semi-finished object A. so that the semi-finished object A forms the plate B. Processing steps after the shaping step (S02) are the same as the embodiment in which the semi-finished object A is formed through semi-solid injection.

Further, before the stamping step (S05) of the foregoing embodiments, a finishing and cropping step (S06) is further included. Through the finishing and cropping step (S06), dimensional accuracy of the housing made of the plate B is ensured, and required surface fineness is obtained. Specifically, the finishing processing is surface grinding.

Based on the foregoing, in the disclosure, densification processing of the material and a change of the mechanical property are completed before the final product of the housing is stamped and formed. In this way, the semi-finished object A forms a plate with surface quality that meets a finished product demand and a mechanical property that is adapted to terminal stamping processing. The finished product is directly formed by stamping without secondary processing, so that the production efficiency is improved. The total reduction rate at which the semi-finished object A is processed is further adjusted to that of the plate B, so as to ensure that after the semi-finished object A forms the plate B, the plate B still maintains the normal temperature formability, so that the plate B is processed into the finished product through a normal temperature machine or process without being limited by a special machine or process.

The disclosure is disclosed through the foregoing embodiments; however, these embodiments are not intended to limit the disclosure, those apparent to persons of ordinary skill in the art may make various changes and modifications without departing from the spirit and scope of the disclosure. The protection scope of the disclosure is subject to the appended claims of the disclosure.

What is claimed is:

1. A manufacturing method of a housing, comprising the following steps:
    an object providing step, providing a semi-finished object comprising a first thickness;
    a shaping step, heat shaping the semi-finished object to form a plate;
    a cooling step, cooling the plate after heat shaping;
    a tempering step, tempering the plate after cooling at a low-temperature, wherein an operating temperature of the tempering step is 90° C. to 160° C.; and
    a stamping step, stamping the plate after tempering at the low-temperature at an ambient temperature to form a housing.

2. The manufacturing method of a housing according to claim 1, wherein the shaping step is rolling.

3. The manufacturing method of a housing according to claim 2, wherein the rolling is hot rolling.

4. The manufacturing method of a housing according to claim 3, wherein the rolling is performing at a temperature 0.5 to 0.7 times of a melting temperature of the semi-finished object.

5. The manufacturing method of a housing according to claim 4, wherein the rolling is performed at a temperature 0.5 times of the melting temperature of the semi-finished object, and the semi-finished object is rolled, for less than 10 times, to form the plate.

6. The manufacturing method of a housing according to claim 5, wherein the semi-finished object is rolled, for three times, to form the plate, and after rolling for the first time, the thickness of the semi-finished object is reduced by 20%; after rolling for the second time, the thickness of the semi-finished object is reduced by 6.6%; and after rolling for the third time, the thickness of the semi-finished object is reduced by 6.6%.

7. The manufacturing method of a housing according to claim 2, wherein the plate comprises a second thickness, and the second thickness is less than the first thickness.

8. The manufacturing method of a housing according to claim 7, wherein the second thickness is 50% to 70% of the first thickness.

9. The manufacturing method of a housing according to claim 1, wherein the semi-finished object is cylindrical, and before the shaping step, a cutting step is further comprised, and in the cutting step, the semi-finished object is cut off.

10. The manufacturing method of a housing according to claim 9, wherein the shaping step is flattening.

11. The manufacturing method of a housing according to claim 1, wherein in the object providing step, the semi-finished object is formed through semi-solid injection.

12. The manufacturing method of a housing according to claim 1, wherein the cooling step is cooling at a cooling speed of 1° C. to 50° C. per second.

13. The manufacturing method of a housing according to claim 1, wherein a material of the semi-finished object is magnalium.

14. The manufacturing method of a housing according to claim 1, wherein before the stamping step, a finishing and cropping step is further comprised.

* * * * *